United States Patent
Maeda

(10) Patent No.: US 9,939,741 B2
(45) Date of Patent: Apr. 10, 2018

(54) LITHOGRAPHY APPARATUS, AND METHOD OF MANUFACTURING ARTICLE

(71) Applicant: CANON KABUSHIKI KAISHA, Tokyo (JP)

(72) Inventor: Hironori Maeda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 494 days.

(21) Appl. No.: 14/559,059

(22) Filed: Dec. 3, 2014

(65) Prior Publication Data

US 2015/0158238 A1  Jun. 11, 2015

(30) Foreign Application Priority Data

Dec. 5, 2013  (JP) .................................. 2013-252413

(51) Int. Cl.
| | | |
|---|---|---|
| G01B 11/27 | (2006.01) | |
| G03F 9/00 | (2006.01) | |
| B29L 31/00 | (2006.01) | |
| G03F 7/00 | (2006.01) | |

(52) U.S. Cl.
CPC .......... *G03F 9/7026* (2013.01); *G03F 9/7084* (2013.01); *G03F 9/7088* (2013.01); *B29L 2031/772* (2013.01); *G03F 7/0002* (2013.01)

(58) Field of Classification Search
CPC .... G03F 9/7026; G03F 9/7084; G03F 9/7088; G03F 7/0002; B29L 2031/772
See application file for complete search history.

(56) References Cited

U.S. PATENT DOCUMENTS

| | | |
|---|---|---|
| 7,084,955 B2 | 8/2006 | Gui et al. |
| 8,659,743 B2 | 2/2014 | Mishima |
| 2005/0157296 A1* | 7/2005 | Hayano ............... G03F 7/70633 356/401 |

(Continued)

FOREIGN PATENT DOCUMENTS

| | | |
|---|---|---|
| JP | H01183816 A | 7/1989 |
| JP | 2002-280299 A | 9/2002 |
| JP | 2005519460 A | 6/2005 |

(Continued)

OTHER PUBLICATIONS

Office Action issued in Japanese Appln. No. 2013-252413 dated Oct. 30, 2017.

(Continued)

*Primary Examiner* — Galen H Hauth
(74) *Attorney, Agent, or Firm* — Rossi, Kimms & McDowell LLP

(57) ABSTRACT

The present invention provides a lithography apparatus including a sensor configured to detect each of an image of a first mark on a first surface of a substrate and a second mark on a second surface opposite to the first surface, and a processor configured to perform processing of deciding a measurement focus position at which the sensor can detect both the image of the first mark and the image of the second mark based on first mark detection information obtained in a focus state of the optical system in which the sensor can detect the image of the first mark, and second mark detection information obtained in a focus state in which the sensor can detect the image of the second mark.

19 Claims, 10 Drawing Sheets

(56) References Cited

U.S. PATENT DOCUMENTS

2009/0015836 A1* 1/2009 Maeda .................... G03F 7/706
  356/400

FOREIGN PATENT DOCUMENTS

| JP | 2005210125 A | 8/2005 |
| JP | 2006114916 A | 4/2006 |
| JP | 2007005649 A | 1/2007 |
| JP | 2011-040549 A | 2/2011 |

OTHER PUBLICATIONS

English Translation of Office Action issued in Japanese Appln. No. 2013-252413 dated Oct. 30, 2017, previously cited in IDS filed Nov. 14, 2017.

* cited by examiner

FIG. 7A
FIG. 7B
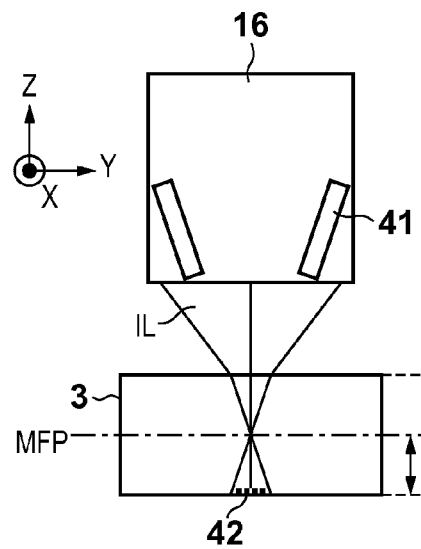
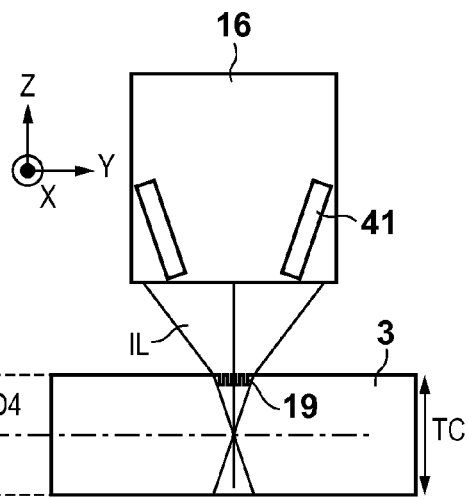
FIG. 8
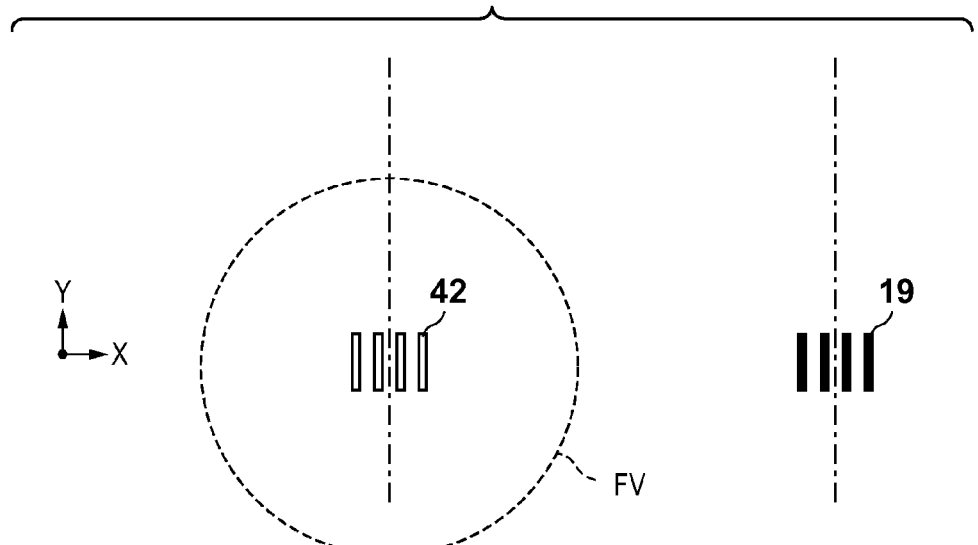

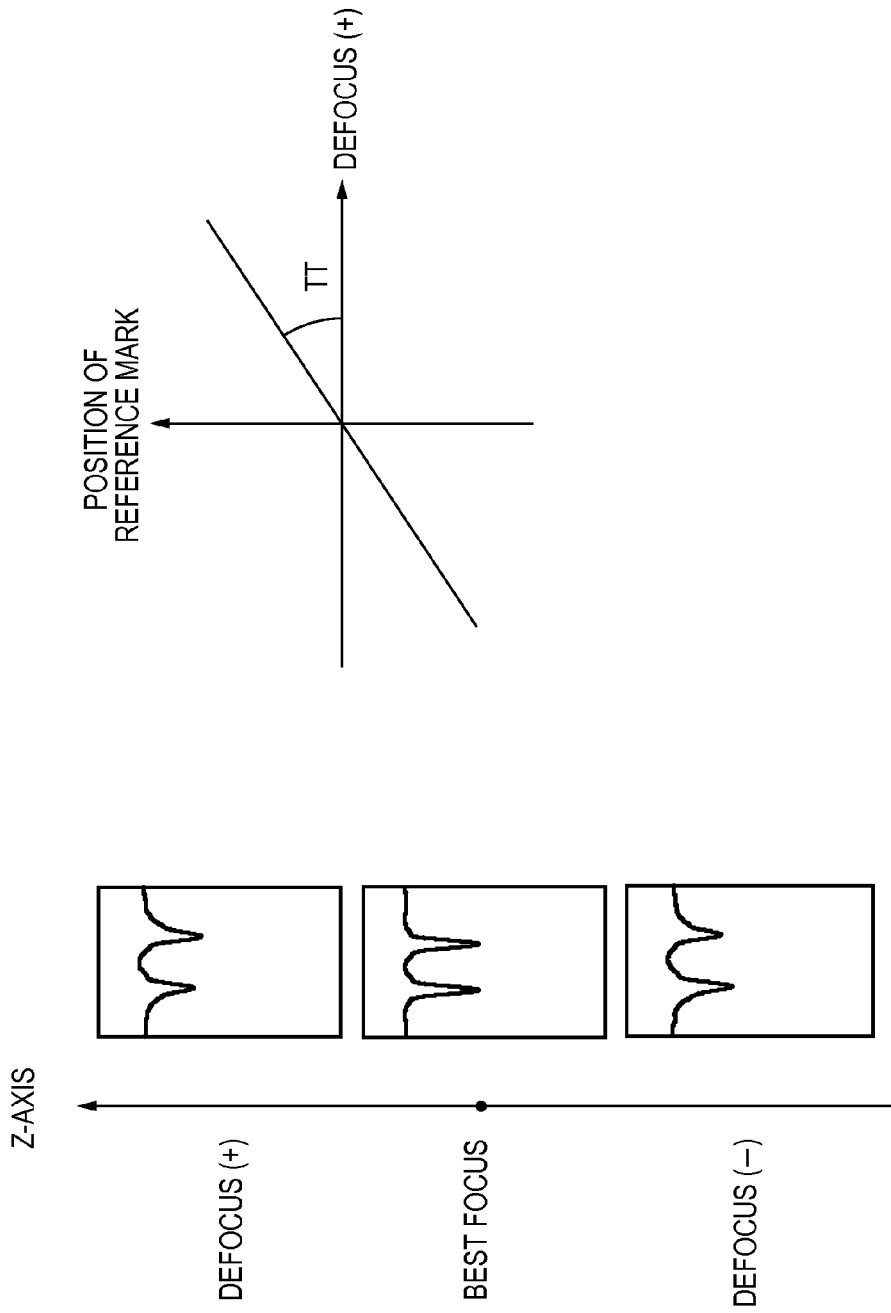

FIG. 10A
FIG. 10B
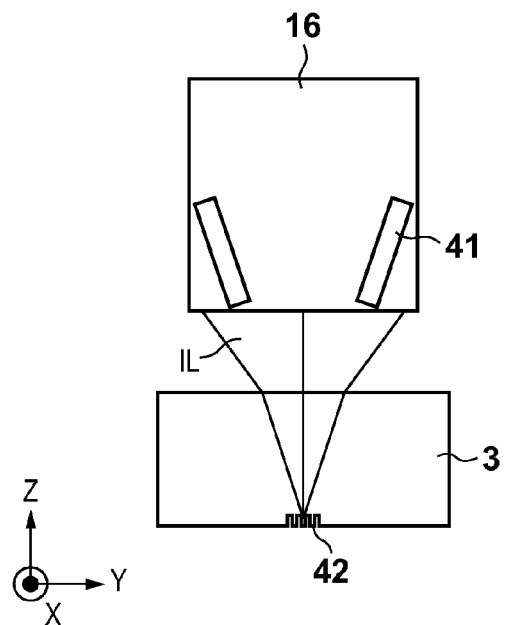
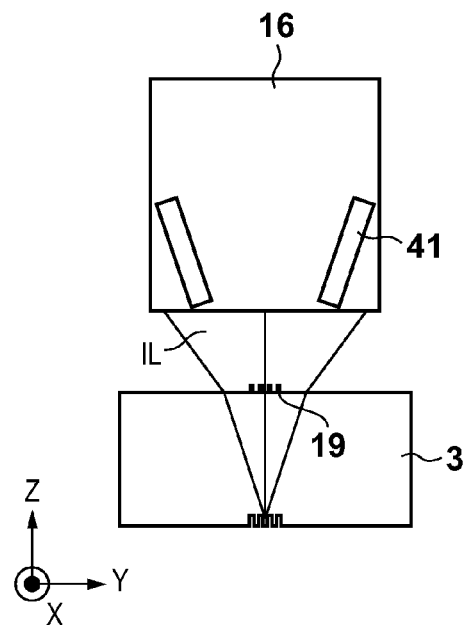

F I G. 12
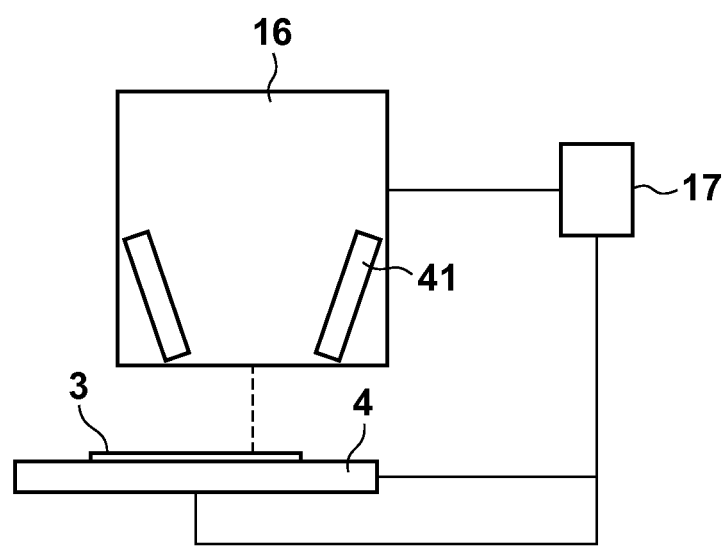

LITHOGRAPHY APPARATUS, AND METHOD OF MANUFACTURING ARTICLE

BACKGROUND OF THE INVENTION

Field of the Invention

The present invention relates to a lithography apparatus and a method of manufacturing an article.

Description of the Related Art

When manufacturing a device (for example, a semiconductor element, liquid crystal display element, or thin-film magnetic head) using a photolithography technique, an exposure apparatus is used, in which the pattern of a reticle (mask) is projected to a substrate such as a wafer through a projection optical system to transfer the pattern.

Recently, exposure apparatuses are requested to manufacture not only IC chips such as a memory and logic, but also special elements (stacked devices using a through via process) such as a MEMS and CMOS image sensor (CIS). The manufacture of such a special element does not require a high line width resolution and overlay accuracy, but requires a large depth of focus, compared to the manufacture of a conventional IC chip.

When manufacturing a special element, a special process is performed to expose the upper surface side of a substrate (for example, an Si wafer) based on an alignment mark formed on the lower surface side of the substrate. This process is necessary to, for example, form a through via from the upper surface side of a substrate and electrically connect the upper surface side to a circuit on the lower surface side of the substrate. Nowadays, technical support for detection (to be referred to as a "lower surface alignment" hereinafter) of an alignment mark formed on the lower surface side of a substrate is becoming important. Especially when exposing the upper surface side of a substrate based on an alignment mark formed on the lower surface side of the substrate, overlay inspection needs to be performed between an alignment mark formed on the upper surface side of the substrate and an alignment mark formed on the lower surface side.

As the lower surface side alignment, Japanese Patent Laid-Open No. 2002-280299 has proposed a technique in which an alignment detection system is constituted on the lower surface side (substrate chuck side) of a substrate. However, when the alignment detection system is constituted on the lower surface side of a substrate, it can detect only alignment marks positioned in the detection region of the alignment detection system, and cannot detect alignment marks positioned at arbitrary positions on the substrate.

Japanese Patent Laid-Open No. 2011-40549 has proposed a technique of detecting an alignment mark formed on the lower surface side of a substrate from the upper surface side of the substrate by using infrared light (light having a wavelength of 1,000 nm or more) that can be transmitted by a substrate.

In general overlay inspection in the exposure apparatus, inner and outer marks formed on the same layer of a substrate are simultaneously detected to obtain the amount of overlay shift between the inner and outer marks. This is because the focus position of an alignment detection system can be adjusted to both the inner and outer marks. A substrate stage that holds a substrate need not be driven in the Z-axis direction (optical axis direction of the alignment detection system) at an interval between detection of the inner mark and detection of the outer mark. Hence, high-accuracy overlay inspection can be implemented.

When manufacturing a special element, it is necessary to perform overlay inspection of an alignment mark (lower surface side mark) formed on the lower surface side of a substrate and an alignment mark (upper surface side mark) formed on the upper surface side of the substrate, as described above. However, the lower surface side mark and upper surface side mark are not formed on the same layer of the substrate and thus cannot be detected simultaneously.

To solve this, in Japanese Patent Laid-Open No. 2011-40549, the upper surface side mark is detected with light (visible light) shorter in wavelength than infrared light. After the substrate stage that holds the substrate is driven in the Z-axis direction, the lower surface side mark is detected with infrared light. In this manner, overlay inspection of the lower surface side mark and upper surface side mark is performed. In this case, however, the focus position of the alignment detection system differs between detection of the upper surface side mark and detection of the lower surface side mark, and needs to be adjusted to each of the upper surface side mark and lower surface side mark. To do this, the substrate stage needs to be driven twice, or the focus adjustment lens of the alignment detection system needs to be driven twice. The accuracy of overlay inspection between the lower surface side mark and the upper surface side mark drops owing to the driving error of the substrate stage or focus adjustment lens.

The alignment detection system may be designed to generate axial chromatic aberration between visible light and infrared light in correspondence with the substrate thickness. This makes it possible to detect the upper surface side mark and the lower surface side mark with visible light and infrared light without driving the substrate stage in the Z-axis direction. In this case, however, overlay inspection can be performed for only a substrate of a predetermined thickness, and cannot cope with a change of the substrate thickness.

SUMMARY OF THE INVENTION

The present invention provides a technique advantageous for detecting marks formed on the first and second surfaces of a substrate.

According to one aspect of the present invention, there is provided a lithography apparatus that forms a pattern on a substrate, the apparatus including a measurement unit configured to measure an amount of overlay shift between a first mark formed on a first surface of the substrate and a second mark formed on a second surface opposite to the first surface, the measurement unit including an optical system configured to illuminate the substrate from a side of the first surface with light of a wavelength transmitted by the substrate, and form an image of the first mark with light returning from the first surface and an image of the second mark with light returning from the second surface, a sensor configured to detect each of the image of the first mark and the image of the second mark, and a processor configured to perform processing of deciding a measurement focus position of the optical system at which the sensor can detect both the image of the first mark and the image of the second mark based on first mark detection information obtained in a focus state of the optical system in which the sensor can detect the image of the first mark, and second mark detection information obtained in a focus state of the optical system in which the sensor can detect the image of the second mark, detecting the image of the first mark and the image of the second mark by the sensor in a first focus state of the optical system in which a focus position of the optical system exists at the measurement focus position, and obtaining a position of the first mark on the first surface and a position of the second mark on the second surface based on the image of the first mark and the image of the second mark that have been detected in the first focus state.

Further aspects of the present invention will become apparent from the following description of exemplary embodiments with reference to the attached drawings.

BRIEF DESCRIPTION OF THE DRAWINGS

FIGS. 7A and 7B are views for explaining overlay inspection according to the embodiment.

FIG. 8 is a view for explaining overlay inspection according to the embodiment.

FIGS. 9A and 9B are views for explaining the defocus characteristic of the substrate alignment detection system.

FIGS. 10A and 10B are views for explaining overlay inspection according to the embodiment.

FIG. 12 is a schematic view showing the arrangement of an overlay inspection apparatus.

DESCRIPTION OF THE EMBODIMENTS

Figure 1:
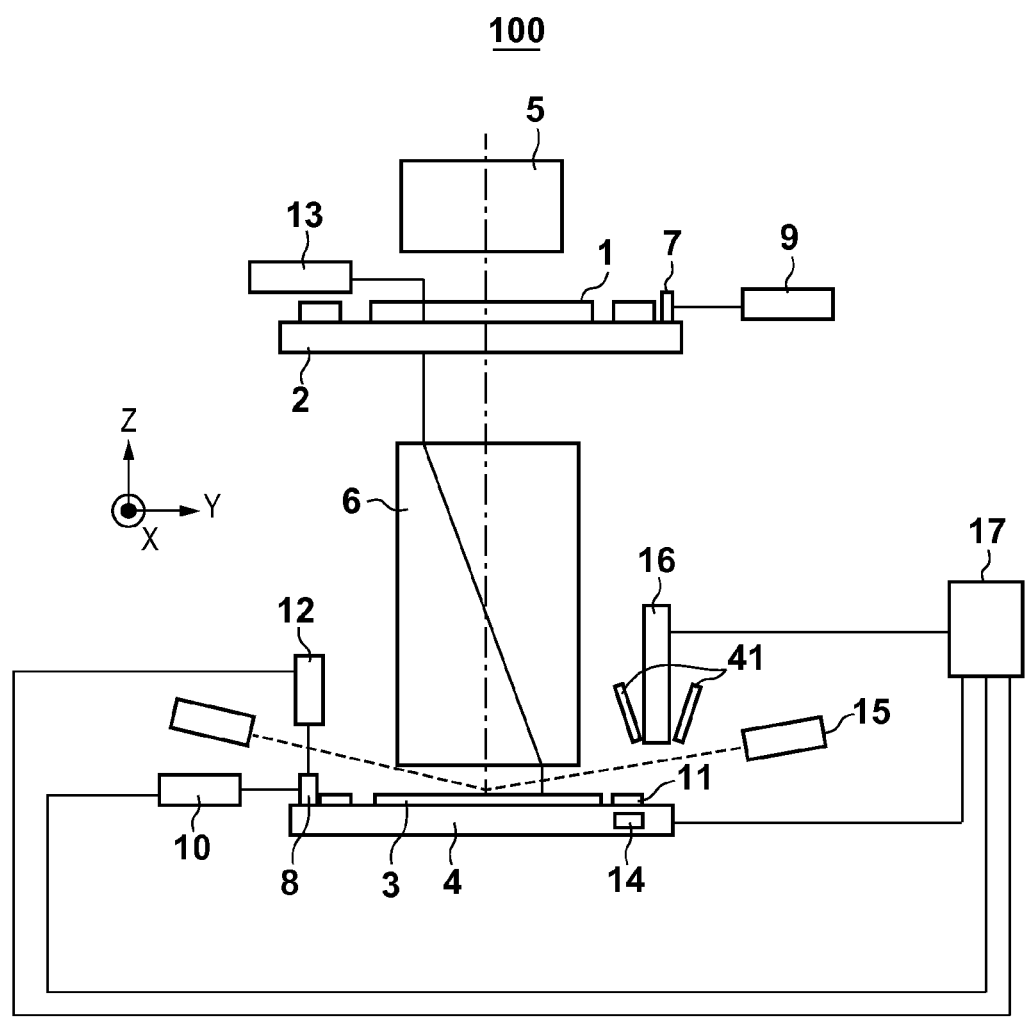
FIG. 1 is a schematic view showing the arrangement of an exposure apparatus as one aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 100 as one aspect of the present invention. The exposure apparatus 100 is a lithography apparatus that forms a pattern on a substrate. The exposure apparatus 100 includes a reticle stage 2 that holds a reticle 1, a substrate stage 4 that holds a substrate 3, and an illumination optical system 5 that illuminates the reticle 1 held by the reticle stage 2. The exposure apparatus 100 also includes a projection optical system 6 that projects (the image of) the pattern of the reticle 1 to the substrate 3 held by the substrate stage 4, and a controller 17 that performs centralized control of the overall operation of the exposure apparatus 100.

In the embodiment, the exposure apparatus 100 is a scanning exposure apparatus (scanner) that transfers the pattern of the reticle 1 to the substrate 3 while synchronously scanning the reticle 1 and the substrate 3 in the scanning direction (that is, by a step & scan method). However, the exposure apparatus 100 may be an exposure apparatus (stepper) that projects the pattern of the reticle 1 to the substrate 3 while fixing the reticle 1 (that is, by a step & repeat method).

In the following description, a direction (optical axis direction) coincident with the optical axis of the projection optical system 6 will be defined as the Z-axis direction. The scanning direction of the reticle 1 and the substrate 3 in a plane perpendicular to the Z-axis direction will be defined the Y-axis direction. A direction (non-scanning direction) perpendicular to the Z- and Y-axis directions will be defined as the X-axis direction. Directions around the X-, Y-, and Z-axes will be defined as θX, θY, and θZ directions, respectively.

The illumination optical system 5 illuminates the reticle 1, more specifically, a predetermined illumination region on the reticle with light (exposure light) of a uniform illuminance distribution. Examples of the exposure light are the g-ray (wavelength: about 436 nm) and i-ray (wavelength: about 365 nm) of ultra-high pressure mercury lamps, a KrF excimer laser (wavelength: about 248 nm), an ArF excimer laser (wavelength: about 143 nm), and an $F_2$ laser (wavelength: about 157 nm). To manufacture a smaller semiconductor element, extreme ultraviolet light (EUV light) of several nm to several hundred nm may be used as the exposure light.

The reticle stage 2 is configured to be two-dimensionally movable in a plane perpendicular to the optical axis of the projection optical system 6, that is, in the X-Y plane and be rotatable in the θZ direction. A driving device (not shown) such as a linear motor performs single- or six-axis driving of the reticle stage 2.

A mirror 7 is arranged on the reticle stage 2. A laser interferometer 9 is arranged at a position facing the mirror 7. The laser interferometer 9 measures in real time the two-dimensional position and rotation angle of the reticle stage 2, and outputs the measurement result to the controller 17. The controller 17 controls the driving device based on the measurement result of the laser interferometer 9, and positions the reticle 1 held by the reticle stage 2.

The projection optical system 6 includes a plurality of optical elements, and projects the pattern of the reticle 1 to the substrate 3 at a predetermined projection magnification β. In the embodiment, the projection optical system 6 is a reduction optical system having the projection magnification β of, for example, ¼ or ⅕.

The substrate stage 4 includes a Z stage that holds the substrate 3 via a chuck, an X-Y stage that supports the Z stage, and a base that supports the X-Y stage. The driving device such as a linear motor drives the substrate stage 4.

A mirror 8 is arranged on the substrate stage 4. Laser interferometers 10 and 12 are arranged at positions facing the mirror 8. The laser interferometer 10 measures positions of the substrate stage 4 in the X-axis direction, Y-axis direction, and θZ direction in real time, and outputs the measurement result to the controller 17. Similarly, the laser interferometer 12 measures positions of the substrate stage 4 in the Z-axis direction, θX direction, and θY direction in real time, and outputs the measurement result to the controller 17. The controller 17 controls the driving device based on the measurement results of the laser interferometers 10 and 12, and positions the substrate 3 held by the substrate stage 4.

A reticle alignment detection system 13 is arranged near the reticle stage 2. The reticle alignment detection system 13 detects a reticle reference mark (not shown) on the reticle 1 held by the reticle stage 2, and a reference mark 39 on a stage reference plate 11 arranged on the substrate stage 4 through the projection optical system 6.

The reticle alignment detection system 13 illuminates the reticle reference mark on the reticle 1, and the reference mark 39 through the projection optical system 6 by using the same light source as one used when actually exposing the substrate 3. The reticle alignment detection system 13 detects, by an image sensor (for example, a photoelectric conversion element such as a CCD camera), beams reflected by the reticle reference mark and the reference mark 39. The reticle 1 and the substrate 3 are positioned (aligned) based on a detection signal from the image sensor. At this time, the position and focus are adjusted between the reticle reference mark on the reticle 1 and the reference mark 39 on the stage reference plate 11. As a result, the relative positional relationship (X, Y, and Z) between the reticle 1 and the substrate 3 can be adjusted.

A reticle alignment detection system 14 is arranged on the substrate stage 4. The reticle alignment detection system 14 is a transmission detection system and is used when the reference mark 39 is a transmission mark. The reticle alignment detection system 14 illuminates the reticle reference mark on the reticle 1 and the reference mark 39 by using the same light source as one used when actually exposing the substrate 3. A light amount sensor detects the transmitted light returning from each mark. At this time, the reticle alignment detection system 14 detects the amount of transmitted light while moving the substrate stage 4 in the X-axis direction (or Y-axis direction) and the Z-axis direction. Accordingly, the position and focus can be adjusted between the reticle reference mark on the reticle 1 and the reference mark 39 on the stage reference plate 11.

In this way, the reticle alignment detection system 13 or the reticle alignment detection system 14 can be arbitrarily used to adjust the relative positional relationship (X, Y, and Z) between the reticle 1 and the substrate 3.

The stage reference plate 11 is arranged at the corner of the substrate stage 4 to be almost flush with the surface of the substrate 3. The stage reference plate 11 may be arranged at one corner of the substrate stage 4, or the stage reference plates 11 may be arranged at a plurality of corners of the substrate stage 4.

Figure 2:
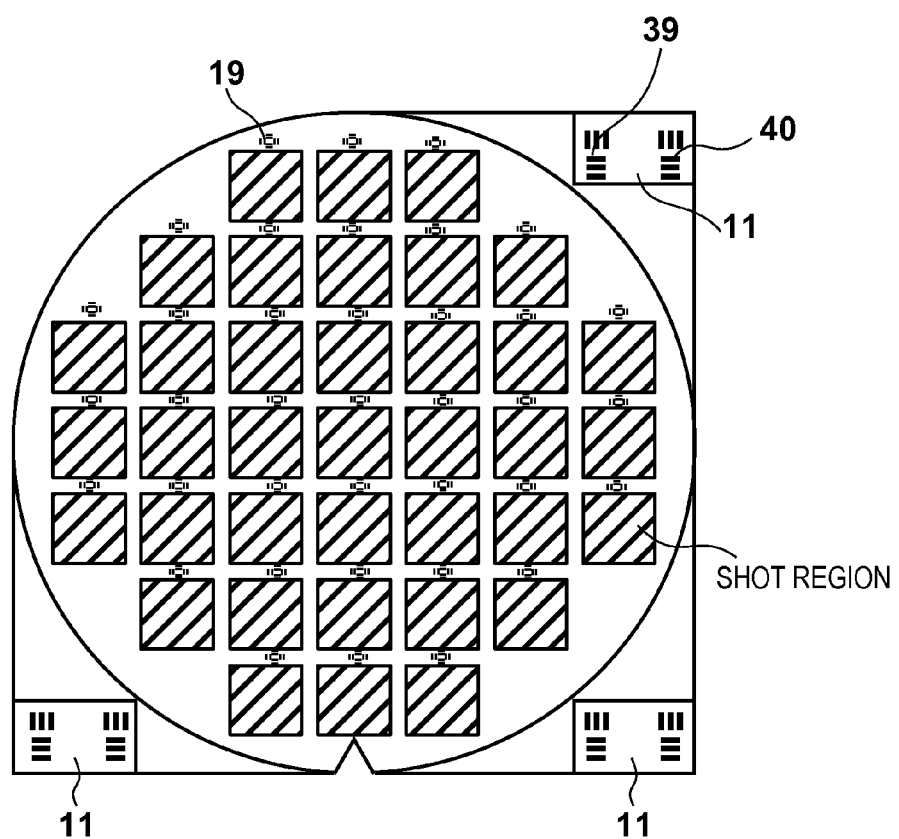
FIG. 2 is a view showing the layout of a stage reference plate arranged on a substrate stage.

As shown in FIG. 2, the stage reference plate 11 includes the reference mark 39 that is detected by the reticle alignment detection system 13 or 14, and a reference mark 40 that is detected by a substrate alignment detection system 16. The stage reference plate 11 may have a plurality of reference marks 39 and a plurality of reference marks 40. The positional relationship (X- and Y-axis directions) between the reference marks 39 and 40 is set to a predetermined one (that is, is known). Note that the reference marks 39 and 40 may be common marks.

A focus detection system 15 includes a projection system that projects light to the surface of the substrate 3, and a light receiving system that receives light reflected by the surface of the substrate 3. The focus detection system 15 detects a position of the substrate 3 in the Z-axis direction, and outputs the detection result to the controller 17. The controller 17 controls the driving device based on the detection result of the focus detection system 15 to drive the substrate stage 4, and adjusts a position of the substrate 3 in the Z-axis direction and the inclination angle of the substrate 3 held by the substrate stage 4.

The substrate alignment detection system 16 includes optical systems such as an illumination system that illuminates an alignment mark formed on the substrate 3 and the reference mark 40 on the stage reference plate 11, and an imaging system that forms the image of a mark with light returning from the mark. The substrate alignment detection system 16 detects the position of the alignment mark formed on the substrate 3 and the position of the reference mark 40, and outputs the detection result to the controller 17. The controller 17 controls the driving device based on the detection result of the substrate alignment detection system 16 to drive the substrate stage 4, and adjusts positions of the substrate 3 in the X- and Y-axis directions that is held by the substrate stage 4.

The substrate alignment detection system 16 includes a focus detection system (AF detection system) 41 for the substrate alignment detection system. Similar to the focus detection system 15, the AF detection system 41 includes a projection system that projects light to the surface of the substrate 3, and a light receiving system that receives light reflected by the surface of the substrate 3. The focus detection system 15 is used for focusing of the projection optical system 6, whereas the AF detection system 41 is used for focusing of the substrate alignment detection system 16.

In general, the arrangement of the substrate alignment detection system is roughly divided into two: an off-axis alignment (OA) detection system and a TTL (Through The Lens alignment) detection system. The OA detection system optically detects an alignment mark formed on a substrate without the intervention of a projection optical system. The TTL detection system detects an alignment mark formed on a substrate through a projection optical system by using light (non-exposure light) different in wavelength from exposure light. Although the substrate alignment detection system 16 is the OA detection system in the embodiment, the present invention does not limit the alignment detection method. For example, when the substrate alignment detection system 16 is the TTL detection system, it detects an alignment mark formed on a substrate through the projection optical system 6. Except this, the basic arrangement is the same as that of the OA detection system.

Figure 3:
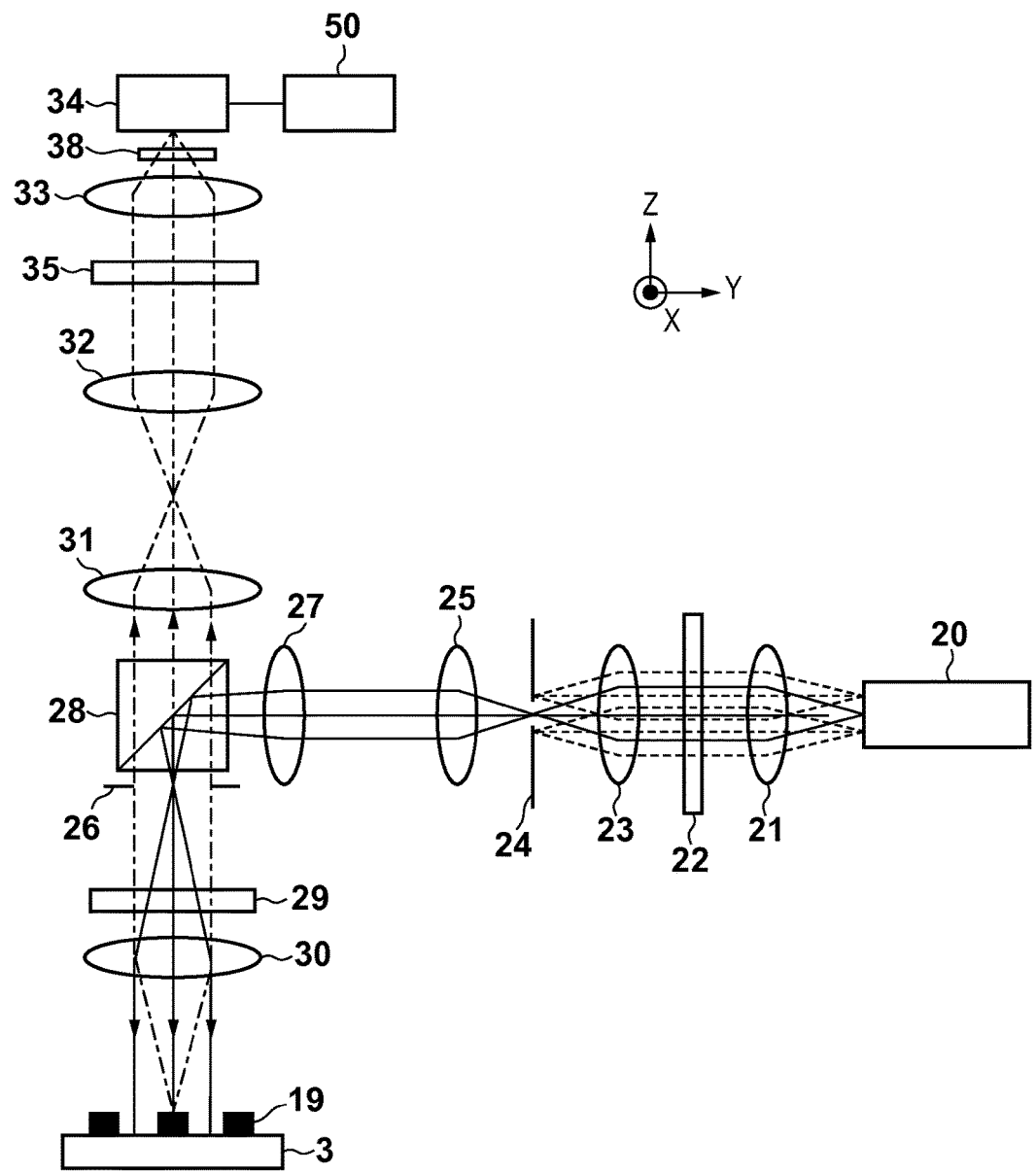
FIG. 3 is a schematic view showing the detailed arrangement of a substrate alignment detection system.

The substrate alignment detection system 16 will be explained in detail with reference to FIG. 3. FIG. 3 is a schematic view showing the detailed arrangement of the substrate alignment detection system 16. The substrate alignment detection system 16 functions as a measurement unit that measures the amount of overlay shift between an alignment mark (first mark) formed on the upper surface (first surface) of the substrate 3 and an alignment mark (second mark) formed on the lower surface (second surface opposite to the first surface) of the substrate 3. A case will be exemplified, in which the substrate alignment detection system 16 detects an alignment mark (to be referred to as an "upper surface side mark" hereinafter) 19 formed on the upper surface side of the substrate 3. Assume that the substrate 3 is an Si wafer.

Figure 4:
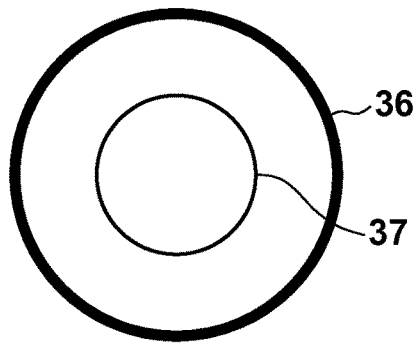
FIG. 4 is a view showing the relationship between a beam diameter at a light source and a beam diameter at an aperture stop plate.

A light source 20 emits visible light (for example, light having a wavelength of 400 nm to 800 nm) as light of a wavelength that is not transmitted by the substrate 3, and infrared light (for example, light having a wavelength of 800 nm to 1,500 nm) as light of a wavelength that is transmitted by the substrate 3. The light emitted by the light source 20 passes through a first relay optical system 21, a wavelength filter plate 22, and a second relay optical system 23, and reaches an aperture stop plate 24 positioned on the pupil plane (optical Fourier transform plane with respect to the object plane) of the substrate alignment detection system 16. Note that a beam diameter 37 at the aperture stop plate 24 is much smaller than a beam diameter 36 at the light source 20, as shown in FIG. 4. FIG. 4 is a view showing the relationship between the beam diameter 36 at the light source 20 and the beam diameter 37 at the aperture stop plate 24.

The wavelength filter plate 22 includes a plurality of filters different in the wavelength band of light to be transmitted. One filter is selected from the plurality of filters under the control of the controller 17, and is inserted in the optical path of the substrate alignment detection system 16. In the embodiment, the wavelength filter plate 22 includes a visible light filter that transmits visible light, and an infrared light filter that transmits infrared light. By switching between these filters, an alignment mark is illuminated with either visible light or infrared light. Note that the wavelength filter plate 22 is configured so that a new filter can be added.

The aperture stop plate 24 includes a plurality of aperture stops different in illumination σ. The aperture stop plate 24 can change the illumination σ of light for illuminating an alignment mark by switching an aperture stop to be inserted in the optical path of the substrate alignment detection system 16 under the control of the controller 17. Note that the aperture stop plate 24 is configured so that a new aperture stop can be added.

Light that has arrived at the aperture stop plate 24 is guided to a polarizing beam splitter 28 through a first illumination system 25 and a second illumination system 27. Of the light guided to the polarizing beam splitter 28, S-polarized light perpendicular to the paper surface of the drawing is reflected by the polarizing beam splitter 28, transmitted by a NA stop 26 and a λ/4 plate 29, and converted into circularly polarized light. The light transmitted by the λ/4 plate 29 passes through an objective lens 30, and illuminates the upper surface side mark 19 formed on the wafer 3. Note that the NA of the NA stop 26 can be changed by changing the aperture value under the control of the controller 17.

Light beams reflected, diffracted, and scattered by the upper surface side mark 19 pass through the objective lens 30, is transmitted by the λ/4 plate 29, and are converted into P-polarized light parallel to the paper surface of the drawing. The P-polarized light is transmitted by the polarizing beam splitter 28 through the NA stop 26. The light transmitted by the polarizing beam splitter 28 forms the image of the upper surface side mark 19 on a photoelectric conversion element (for example, a sensor such as a CCD) 34 through a relay lens 31, a first imaging system 32, a coma adjustment optical member 35, and a second imaging system 33. The photoelectric conversion element 34 senses (detects) the image of the upper surface side mark 19 and obtains a detection signal. When the image of an alignment mark formed on the lower surface of a substrate is formed on the photoelectric conversion element 34, the photoelectric conversion element 34 senses the image of this alignment mark and obtains a detection signal.

When the substrate alignment detection system 16 detects the upper surface side mark 19 formed on the substrate 3, monochromatic light or light of a narrow wavelength band generates interference fringes because a resist (transparent layer) is applied (formed) on the upper surface side mark 19. When this happens, a signal of the interference fringes is added to a detection signal from the photoelectric conversion element 34, and the upper surface side mark 19 cannot be detected with high accuracy. Normally, a light source that emits light of a wide wavelength band is used as the light source 20 to prevent addition of a signal of interference fringes to a detection signal from the photoelectric conversion element 34.

A processor 50 performs processing of obtaining the position of an alignment mark on a substrate based on the image of the alignment mark sensed by the photoelectric conversion element 34. In the embodiment, the processor 50 performs processing regarding overlay inspection of an alignment mark formed on the upper surface of the substrate 3 and an alignment mark formed on the lower surface of the substrate 3, which will be described later. However, the controller 17 may have the function of the processor 50.

Figure 5A:
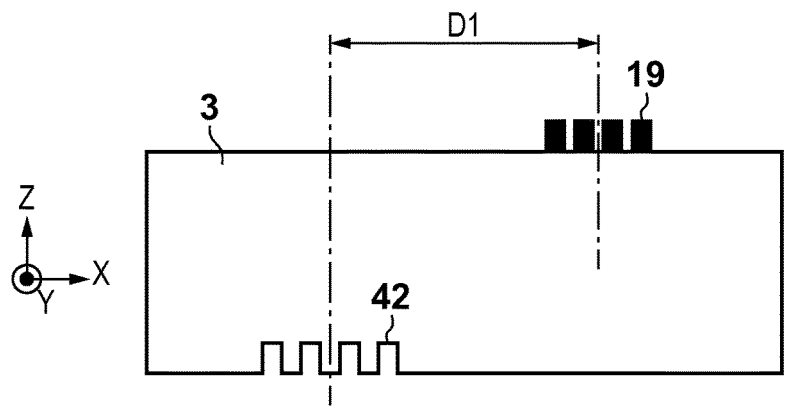
FIGS. 5A to 5C are views for explaining conventional overlay inspection.
Figures 5B, 5C:
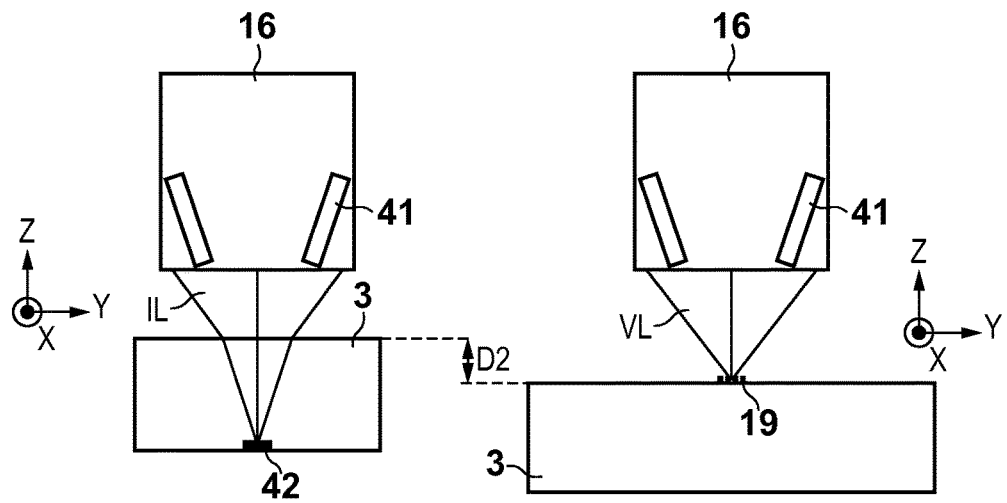

Overlay inspection of the upper surface side mark 19 formed on the upper surface side of the substrate 3 and an alignment mark (to be referred to as a "lower surface side mark" hereinafter) 42 formed on the lower surface side of the substrate 3 will be explained with reference to FIGS. 5A to 5C. First, conventional overlay inspection will be described. FIG. 5A is a schematic view showing the section of the substrate 3 on which the upper surface side mark 19 and the lower surface side mark 42 are formed. As shown in FIG. 5A, the upper surface side mark 19 and the lower surface side mark 42 are spaced apart from each other by a distance D1 in the X-axis direction. In the conventional overlay inspection, the overlay shift amount is obtained by individually detecting the positions of the upper surface side mark 19 and lower surface side mark 42. More specifically, the lower surface side mark 42 is detected with infrared light IL, as shown in FIG. 5B. The upper surface side mark 19 is detected with visible light VL, as shown in FIG. 5C. However, the lower surface side mark 42 and upper surface side mark 19 are not formed on the same layer of the substrate. Therefore, as shown in FIGS. 5B and 5C, when detecting the lower surface side mark 42 and then the upper surface side mark 19, the substrate 3 (substrate stage 4) is driven by a distance D2 in the Z-axis direction in order to adjust the focus position of the substrate alignment detection system 16. In other words, when detecting the lower surface side mark 42, the focus position of the substrate alignment detection system 16 is adjusted to the lower surface of the substrate 3. When detecting the upper surface side mark 19, the focus position of the substrate alignment detection system 16 is adjusted to the upper surface of the substrate 3. In both the case in which the lower surface side mark 42 is detected and the case in which the upper surface side mark 19 is detected, the mark image can be detected in a best focus state to obtain high contrast. However, since the substrate stage 4 is driven in the Z-axis direction, driving errors are generated in the X- and Y-axis directions, decreasing the accuracy of overlay inspection of the upper surface side mark 19 and lower surface side mark 42.

According to the embodiment, overlay inspection of the upper surface side mark 19 and the lower surface side mark 42 can be performed with high accuracy. For example, in the embodiment, the lower surface side mark 42 and upper surface side mark 19 are simultaneously detected without driving the substrate stage 4 in the Z-axis direction.

First, the substrate alignment detection system 16 is focused on each of the lower surface side mark 42 and upper surface side mark 19. In this state, the lower surface side mark 42 and upper surface side mark 19 are detected to obtain pieces of detection information of the lower surface side mark 42 and upper surface side mark 19. In other words, the lower surface side mark 42 is detected in a focus state in which the photoelectric conversion element 34 can detect the image of the lower surface side mark 42. Also, the upper surface side mark 19 is detected in a focus state in which the photoelectric conversion element 34 can detect the image of the upper surface side mark 19. At this time, the detection of the lower surface side mark 42 uses the infrared light IL as measurement light, and the detection of the upper surface side mark 19 also uses the infrared light IL as measurement light.

The detection information (second mark detection information) of the lower surface side mark 42 and the detection information (first mark detection information) of the upper surface side mark 19 obtained in this fashion are pieces of information obtained by detecting the lower surface side mark 42 and upper surface side mark 19. This detection information includes at least one of, for example, the contrast of the mark image, the position of the substrate stage 4 at the time of mark detection, the waveform symmetry of a detection signal corresponding to the mark image or the waveform tilt of the detection signal corresponding to the mark image. The embodiment will exemplify the contrast of the mark image as the detection information of each of the lower surface side mark 42 and upper surface side mark 19. The contrast (second contrast) of the image of the lower surface side mark 42 upon detecting the lower surface side mark 42 with the infrared light IL will be referred to as lower surface contrast. The contrast (first contrast) of the image of the upper surface side mark 19 upon detecting the upper surface side mark 19 with the infrared light IL will be referred to as upper surface contrast.

In the embodiment, a position of the substrate stage 4 in the Z-axis direction when detecting the lower surface side mark 42 and upper surface side mark 19, that is, the measurement focus position of the substrate alignment detection system 16 is decided based on the lower surface contrast and upper surface contrast. The measurement focus position is a focus position where the photoelectric conversion element 34 can detect both the lower surface side mark 42 and upper surface side mark 19. In a focus state (first focus state) in which the focus position of the substrate alignment detection system 16 exists at the measurement focus position, the images of the lower surface side mark 42 and upper surface side mark 19 can be detected simultaneously.

Figure 6A:
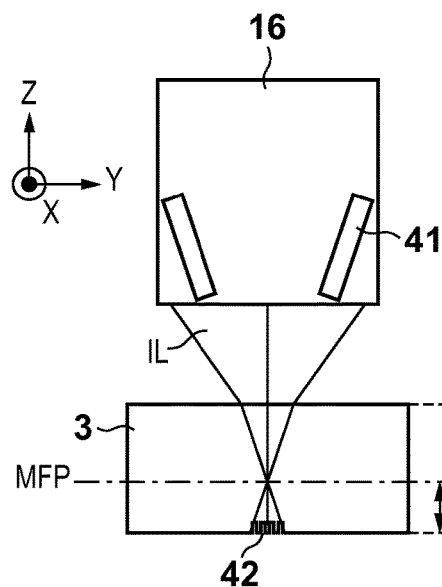
FIGS. 6A to 6C are views for explaining overlay inspection according to an embodiment.
Figure 6B:
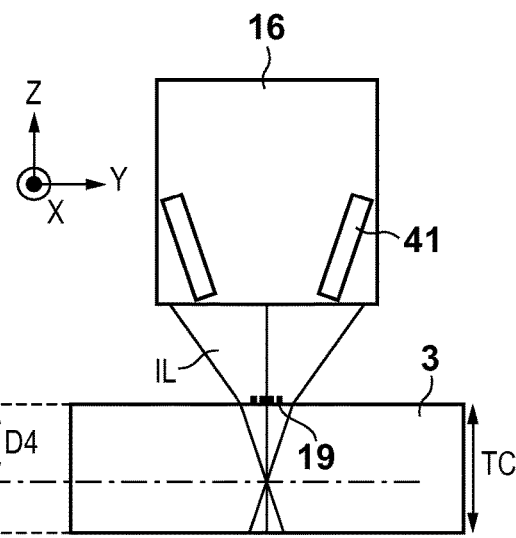

FIGS. 6A and 6B are views showing a state in which the images of the lower surface side mark 42 and upper surface side mark 19 are detected simultaneously in the embodiment. As shown in FIGS. 6A and 6B, the focus position of the substrate alignment detection system 16 is adjusted to (exists at) an measurement focus position MFP, and is adjusted to neither the lower surface side mark 42 nor the upper surface side mark 19. The measurement focus position MFP is decided based on the lower surface contrast, the upper surface contrast, and a thickness (distance between the upper and lower surfaces) TC of the substrate 3.

For example, a case will be examined, in which the upper surface contrast is double the lower surface contrast, more specifically, the lower surface contrast is 0.1 and the upper surface contrast is 0.2. D3 is a distance from the focus position of the substrate alignment detection system 16 to the lower surface of the substrate 3, and D4 is a distance from the focus position of the substrate alignment detection system 16 to the upper surface of the substrate 3. In this case, the measurement focus position MFP is determined so that the ratio of the distance D3 and distance D4 coincides with the ratio (1:2) of the lower surface contrast and upper surface contrast. In other words, a position where the thickness TC of the substrate 3 is divided at the ratio (2:1) of the upper surface contrast and lower surface contrast from the upper surface side is set as the measurement focus position MFP. With this setting, both the lower surface side mark 42 and upper surface side mark 19 can be detected simultaneously with satisfactorily detectable contrast.

According to the embodiment, the lower surface contrast and upper surface contrast are compared with each other, and the focus position of the substrate alignment detection system 16 is brought close to a lower-contrast mark out of the lower surface side mark 42 and upper surface side mark 19. It is desirable to obtain in advance a change of the contrast with respect to the defocus of each of the lower surface side mark 42 and upper surface side mark 19. This makes it possible to determine whether the lower surface side mark 42 and upper surface side mark 19 can be detected with satisfactorily detectable contrast even when the focus position of the substrate alignment detection system 16 is defocused from the lower surface side mark 42 or upper surface side mark 19.

Figure 6C:
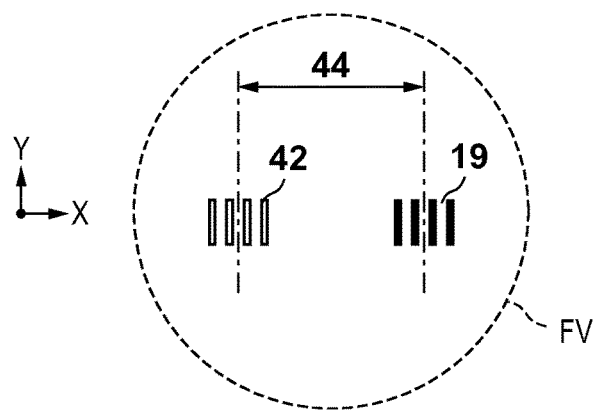

Detection of the lower surface side mark 42 needs to use the infrared light IL transmitted by the substrate 3. Even when simultaneously detecting both the lower surface side mark 42 and upper surface side mark 19, the infrared light IL transmitted by the substrate 3 needs to be used, as shown in FIGS. 6A and 6B. FIG. 6C is a view showing, in an X-Y coordinate system, the result of simultaneously detecting the lower surface side mark 42 and upper surface side mark 19 in the states shown in FIGS. 6A and 6B. In FIG. 6C, both the lower surface side mark 42 and upper surface side mark 19 are positioned in a field of view FV of the substrate alignment detection system 16. Thus, the lower surface side mark 42 and upper surface side mark 19 can be simultaneously detected without driving the substrate stage 4.

In this fashion, according to the embodiment, each of the lower surface side mark 42 and upper surface side mark 19 is detected in advance in the best focus state by using the infrared light IL, thereby obtaining detection information of the lower surface side mark 42 and detection information of the upper surface side mark 19. The measurement focus position MFP is decided based on pieces of detection information of the lower surface side mark 42 and upper surface side mark 19 obtained in advance, and the thickness TC of the substrate 3. Note that the thickness TC of the substrate 3 may be obtained in advance, or can also be estimated from the pieces of detection information of the lower surface side mark 42 and upper surface side mark 19 (that is, detection of the lower and upper surfaces of the substrate 3).

In the embodiment, detection information of each of the lower surface side mark 42 and upper surface side mark 19 is regarded as the contrast of the mark image, and the measurement focus position MFP is decided using this contrast as an index. Alternatively, the measurement focus position MFP may be decided using, as an index, detection information other than the contrast, for example, the waveform symmetry and waveform tilt of a detection signal corresponding to the mark image.

It is also conceivable that the intermediate position between the upper and lower surfaces of the substrate 3 is set as the measurement focus position MFP to simultaneously detect the lower surface side mark 42 and upper surface side mark 19. Generally, when detecting the lower surface side mark 42, infrared light that has been transmitted by the substrate 3 and reflected by the lower surface side mark 42 is detected. This infrared light is influenced by infrared light reflected by the upper surface of the substrate 3. Therefore, the lower surface contrast tends to be lower than the upper surface contrast. If the intermediate position between the upper and lower surfaces of the substrate 3 is set as the measurement focus position MFP, the lower surface contrast becomes low, and the lower surface side mark 42 may not be able to be detected with satisfactory accuracy.

Considering this, in the embodiment, the measurement focus position MFP is determined based on the lower surface contrast and upper surface contrast obtained in advance. However, for example, when the lower surface side mark 42 is made from a metal and the upper surface side mark 19 is formed from a step, the lower surface contrast and upper surface contrast may become equal to each other. In such a case, even if the intermediate position between the upper and lower surfaces of the substrate 3 is set as the measurement focus position MFP, the lower surface side mark 42 and upper surface side mark 19 can be detected simultaneously.

FIGS. 7A and 7B are views showing a state in which the images of the lower surface side mark 42 and upper surface side mark 19 are detected simultaneously when the lower surface side mark 42 is made from a metal and the upper surface side mark 19 is formed from a step. In this case, the lower surface contrast and upper surface contrast sometimes have the same value. For example, assume that the lower surface contrast is 0.15, and the upper surface contrast is 0.15. In this case, the ratio of the upper surface contrast and lower surface contrast is 1:1. The measurement focus position MFP is decided so that the ratio of the distance D3 from the focus position of the substrate alignment detection system 16 to the lower surface of the substrate 3 and the distance D4 to the upper surface of the substrate 3 coincides with the ratio (1:1) of the lower surface contrast and upper surface contrast. In other words, the position where the thickness TC of the substrate 3 is divided at the ratio (1:1) of the upper surface contrast and lower surface contrast from the upper surface side, that is, the intermediate position between the upper and lower surfaces of the substrate 3 is set as the measurement focus position MFP. With this setting, both the lower surface side mark 42 and upper surface side mark 19 can be detected simultaneously with satisfactorily detectable contrast.

As described above, when the ratio of the lower surface contrast and upper surface contrast is 1:1, the intermediate position between the upper and lower surfaces of the substrate 3 is decided as the measurement focus position MFP. However, when the lower surface side mark 42 is made from a metal, the lower surface contrast is sufficiently high, so the intermediate position between the upper and lower surfaces of the substrate 3 may be set as the measurement focus position MFP regardless of the ratio of the lower surface contrast and upper surface contrast. As long as the thickness TC of the substrate 3 is obtained, the lower surface side mark 42 and upper surface side mark 19 can be simultaneously detected without detecting in advance each of the lower surface side mark 42 and upper surface side mark 19 in the best focus state. This is advantageous for the throughput. In this case, the AF detection system 41 detects the upper surface of the substrate 3, and the substrate stage 4 is driven to reach the intermediate position of the thickness TC of the substrate 3 from the upper surface of the substrate 3 that has been detected by the AF detection system 41.

In FIGS. 5B, 5C, 6A, 6B, 7A, and 7B, the upper surface side mark 19 is not illustrated in the drawings showing detection of the lower surface side mark 42, and the lower surface side mark 42 is not illustrated in the drawings showing detection of the upper surface side mark 19 for easy understanding of the present invention. In these drawings, the lower surface side mark 42 and upper surface side mark 19 are arranged on the optical axis of the substrate alignment detection system 16. In practice, however, the lower surface side mark 42 and upper surface side mark 19 do not overlap each other. As shown in FIG. 6C, both the lower surface side mark 42 and upper surface side mark 19 are actually positioned in the field of view FV of the substrate alignment detection system 16. When both the lower surface side mark 42 and upper surface side mark 19 are positioned in the field of view FV of the substrate alignment detection system 16, they can be simultaneously detected without driving the substrate stage 4 in the X-, Y-, and Z-axis directions. However, only the lower surface side mark 42 or upper surface side mark 19 may be positioned in the field of view FV of the substrate alignment detection system 16, as shown in FIG. 8. In this case, the substrate stage 4 needs to be driven in the X-axis direction, but the lower surface side mark 42 and upper surface side mark 19 can be detected without driving the substrate stage 4 in the Z-axis direction. In the lithography apparatus, the driving accuracy of the substrate stage 4 in the X- and Y-axis directions is generally higher than the driving accuracy of the substrate stage 4 in the Z-axis direction. Hence, even when the substrate stage 4 is driven in the X-axis direction, if the lower surface side mark 42 and upper surface side mark 19 can be detected without driving the substrate stage 4 in the Z-axis direction, this is advantageous for the overlay inspection accuracy.

According to the embodiment, in order to perform overlay inspection with higher accuracy, defocus shifts contained in the result (second detection value) of detecting the lower surface side mark 42 and the result (first detection value) of detecting the upper surface side mark 19 can also be corrected. The defocus shift is an error arising from a defocus, and is the amount of shift generated in accordance with the inclination of the optical axis of the substrate alignment detection system 16, and the defocus amount of the substrate alignment detection system 16 with respect to the lower surface side mark 42 or upper surface side mark 19. As the inclination of the optical axis of the substrate alignment detection system 16 becomes larger, and as the defocus amount of the substrate alignment detection system 16 becomes larger, the defocus shift becomes larger (that is, the generated shift amount becomes larger).

Correction of the defocus shift according to the embodiment will be explained. As described above, in the embodiment, the lower surface side mark 42 and upper surface side mark 19 can be detected without driving the substrate stage 4 in the Z-axis direction. Since the lower surface side mark 42 and upper surface side mark 19 are detected in a state defocused from the focus position of the substrate alignment detection system 16, a defocus shift is generated. This defocus shift at the time of detecting the lower surface side mark 42 and upper surface side mark 19 is corrected by obtaining the defocus characteristic of the substrate alignment detection system 16 using the reference mark 40 formed on the stage reference plate 11.

FIGS. 9A and 9B are views for explaining the defocus characteristic of the substrate alignment detection system 16. First, as represented by the middle stage of FIG. 9A, the position of the reference mark 40 is obtained from a detection waveform obtained by detecting the reference mark 40 at the best focus position of the substrate alignment detection system 16. Then, the substrate stage 4 is driven in the Z-axis direction (that is, is defocused), and the position of the reference mark 40 is obtained from a detection waveform obtained by detecting the reference mark 40, as represented by the upper and lower stages of FIG. 9A. If the optical axis of the substrate alignment detection system 16 is inclined, the detection waveform obtained in the defocused state contains a distortion, as represented by the upper and lower stages of FIG. 9A, and the position of the reference mark 40 shifts from the best focus state. FIG. 9B is a graph showing the relationship between the focus state of the substrate alignment detection system 16 and the position of the reference mark 40 that is obtained from the detection waveform. In FIG. 9B, the abscissa represents the defocus, and the ordinate represents the position of the reference mark 40. Referring to FIG. 9B, a tilt TT of the position of the reference mark 40 with respect to the defocus is the defocus characteristic, and indicates the tilt of the optical axis of the substrate alignment detection system 16.

The defocus shift amount at the time of detecting the upper surface side mark 19 is obtained from the product of the defocus characteristic of the substrate alignment detection system 16 and the defocus amount (distance D4 in FIG. 6A) at the time of detecting the upper surface side mark 19. Thus, the true position (first correction value) of the upper surface side mark 19 can be obtained from the result (first detection value) of the upper surface side mark 19−defocus characteristic×defocus amount. In other words, the first correction value can be obtained by subtracting, from the first detection value, the product of the defocus characteristic and the distance from the measurement focus position MFP to the upper surface of the substrate 3.

In contrast, as for the lower surface side mark 42, the defocus shift correction needs to consider the refractive index of the substrate 3 because the infrared light IL is transmitted by (passes through) the substrate 3. More specifically, the true position (second correction value) of the lower surface side mark 42 can be obtained from the result (second detection value) of detecting the lower surface side mark 42−{defocus characteristic/refractive index of the substrate 3}×defocus amount. In other words, the second correction value can be obtained by subtracting, from the second detection value, the product of a value obtained by dividing the defocus characteristic by the refractive index of the substrate 3, and the distance from the measurement focus position MFP to the lower surface of the substrate 3.

In this way, the embodiment can implement high-accuracy overlay inspection by correcting the defocus shift, in addition to detecting the lower surface side mark 42 and upper surface side mark 19 without driving the substrate stage 4 in the Z-axis direction.

In the embodiment, the defocus characteristic of the substrate alignment detection system 16 is obtained using the reference mark 40 formed on the stage reference plate 11, but may be obtained using a mark other than the reference mark 40. However, if the mark for obtaining the defocus characteristic of the substrate alignment detection system 16 is distorted, the defocus characteristic cannot be obtained with high accuracy (that is, an error is included). To avoid this, a mark almost free from a distortion is preferably used.

In the above description, the lower surface side mark 42 and upper surface side mark 19 are detected while the substrate alignment detection system 16 is focused on a position between the upper and lower surfaces of the substrate 3. When the thickness TC of the substrate 3 is relatively small, the lower surface side mark 42 and upper surface side mark 19 can also be detected while the substrate alignment detection system 16 is focused on the lower surface side mark 42. In this case, the lower surface side mark 42 is detected in the best focus state, so no defocus shift is generated for the lower surface side mark 42.

Also, as described above, when detecting the lower surface side mark 42, the contrast tends to be relatively low under the influence of infrared light reflected by the upper surface of the substrate 3, compared to detecting the upper surface side mark 19. It is therefore effective to set a threshold for the lower surface contrast, and when the lower surface contrast is low, detect the lower surface side mark 42 and upper surface side mark 19 while the substrate alignment detection system 16 is focused on the lower surface side mark 42. When the thickness TC of the substrate 3 is satisfactorily large, if the substrate alignment detection system 16 is focused on the lower surface side mark 42, the upper surface side mark 19 is greatly defocused and cannot be detected. For this reason, it is effective to focus the substrate alignment detection system 16 on the lower surface side mark 42, that is, decide the position of the lower surface of the substrate 3 as the measurement focus position MFP particularly when the thickness TC of the substrate 3 is relatively small.

FIGS. 10A and 10B are views showing a state in which the images of the lower surface side mark 42 and upper surface side mark 19 are detected simultaneously while the substrate alignment detection system 16 is focused on the lower surface side mark 42. A case will be explained, in which the substrate alignment detection system 16 is focused on the lower surface side mark 42 to detect the lower surface side mark 42 and upper surface side mark 19 when the lower surface contrast is lower than the upper surface contrast by a threshold or more. Here, assume that when the ratio of the upper surface contrast and lower surface contrast is lower than a set threshold of ¼, the lower surface side mark 42 and upper surface side mark 19 are detected while the substrate alignment detection system 16 is focused on the lower surface side mark 42.

For example, when the lower surface contrast is 0.1 and the upper surface contrast is 0.5, the lower surface contrast/upper surface contrast is ⅕, which is lower than the threshold of ¼. In such a case, the lower surface side mark 42 is detected while the substrate alignment detection system 16 is focused on the lower surface side mark 42, as shown in FIG. 10A. The upper surface side mark 19 is also detected while the substrate alignment detection system 16 is focused on the lower surface side mark 42 (that is, without driving the substrate stage 4 in the Z-axis direction), as shown in FIG. 10B. The lower surface side mark 42 whose contrast tends to be low can be detected satisfactorily. Note that it suffices to perform the defocus shift correction on only the result (first detection value) of detecting the upper surface side mark 19.

Instead of setting the threshold for the lower surface contrast/upper surface contrast, the threshold may be set for the lower surface contrast. For example, the threshold is set to be 0.07. If the lower surface contrast is equal to or lower than 0.07, the lower surface side mark 42 and upper surface side mark 19 are detected while the substrate alignment detection system 16 is focused on the lower surface side mark 42 regardless of the lower surface contrast/upper surface contrast. When the lower surface contrast is 0.07 and the upper surface contrast is 0.21, the lower surface contrast/upper surface contrast is ⅓, which is higher than the above-mentioned threshold of ¼. In this case, the measurement focus position MFP is decided based on the upper surface contrast and lower surface contrast without focusing the substrate alignment detection system 16 on the lower surface side mark 42. However, when the lower surface contrast is 0.07, a contrast enough to satisfactorily detect the lower surface side mark 42 is not obtained, and the lower surface side mark 42 may not be detectable in the defocused state. In such a case, it is effective to set the threshold for the lower surface contrast.

In the above description, the upper surface side mark 19 is always defocused with respect to the lower surface side mark 42. The line width of the upper surface side mark 19 is desirably set to be larger than that of the lower surface side mark 42. This can reduce the influence of the decrease in contrast even if the upper surface side mark 19 is greatly defocused.

In the embodiment, the lower surface side mark 42 and upper surface side mark 19 can be detected without driving the substrate stage 4 in the Z-axis direction, and high-accuracy overlay inspection can be implemented without the influence of the driving error of the substrate stage 4. However, depending on the thickness TC of the substrate 3, it may be impossible to detect the lower surface side mark 42 and upper surface side mark 19 without driving the substrate stage 4 in the Z-axis direction. If the lower surface contrast is low, the lower surface side mark 42 and upper surface side mark 19 may not be detectable unless the substrate alignment detection system 16 is focused on the lower surface side mark 42.

Figure 11:
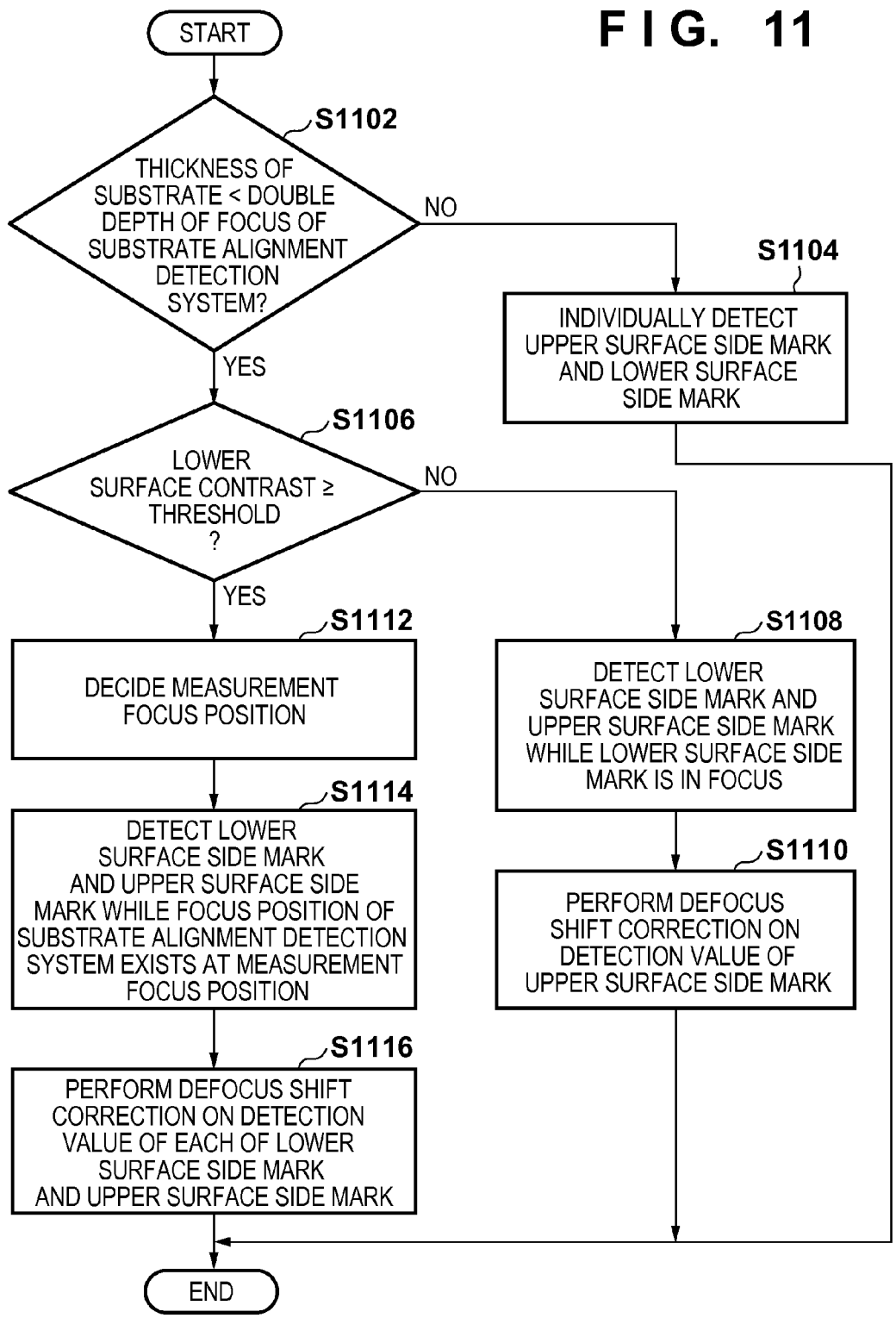
FIG. 11 is a flowchart for explaining overlay inspection according to the embodiment.

FIG. 11 is a flowchart for explaining overlay inspection according to the embodiment. In step S1102, it is determined whether the thickness TC of the substrate 3 is smaller than double the depth of focus of the substrate alignment detection system 16 (that is, whether the thickness TC of the substrate 3 is smaller than the double distance of the depth of focus of the substrate alignment detection system 16). If the thickness TC of the substrate 3 is equal to or larger than double the depth of focus of the substrate alignment detection system 16 (that is, the thickness TC of the substrate 3 is equal to or larger than the double distance of the depth of focus of the substrate alignment detection system 16), the process shifts to step S1104. If the thickness TC of the substrate 3 is smaller than double the depth of focus of the substrate alignment detection system 16, the process shifts to step S1106.

If the thickness TC of the substrate 3 is equal to or larger than double the depth of focus of the substrate alignment detection system 16, the lower surface side mark 42 and upper surface side mark 19 cannot be detected without driving the substrate stage 4 in the Z-axis direction. In step S1104, therefore, the substrate stage 4 is driven in the Z-axis direction to individually detect the upper surface side mark 19 and lower surface side mark 42.

In step S1106, it is determined whether the lower surface contrast is equal to or higher than the threshold (that is, the lower surface contrast is obtained satisfactorily). If the lower surface contrast is lower than the threshold, the process shifts to step S1108. If the lower surface contrast is equal to or higher than the threshold, the process shifts to step S1112.

In step S1108, the lower surface side mark 42 and upper surface side mark 19 are detected while the substrate alignment detection system 16 is focused on the lower surface side mark 42. At this time, the upper surface side mark 19 is detected in the defocused state. In step S1110, the defocus shift correction is performed on the detection value of the upper surface side mark 19 detected in step S1108.

In step S1112, the measurement focus position MFP is decided based on the lower surface contrast, the upper surface contrast, and the thickness TC of the substrate 3. In step S1114, the lower surface side mark 42 and upper surface side mark 19 are detected while the focus position of the substrate alignment detection system 16 exists at the measurement focus position MFP. At this time, the lower surface side mark 42 and upper surface side mark 19 are detected in the defocused state. In step S1116, the defocus shift correction is performed on the detection values of the lower surface side mark 42 and upper surface side mark 19 detected in step S1112.

The exposure apparatus 100 according to the embodiment can perform, with high accuracy, overlay inspection of the upper surface side mark 19 formed on the upper surface of the substrate 3 and the lower surface side mark 42 formed on the lower surface of the substrate 3 (can obtain an overlay error with high accuracy). The exposure apparatus 100 can provide an article such as a high-quality device (for example, a semiconductor integrated circuit element or liquid crystal display element) at high throughput and low cost. A method of manufacturing an article such as a device includes a step of forming a pattern on a substrate (for example, a wafer, glass plate, or film-like substrate) using the exposure apparatus 100, and a step of processing (for example, developing or etching) the substrate on which the pattern has been formed. The method of manufacturing an article according to the embodiment is superior to a conventional method in at least one of the performance, quality, productivity, and production cost of the article.

The embodiment has described overlay inspection using the substrate alignment detection system 16 of the exposure apparatus 100. However, the present invention is not limited to the detection system of the exposure apparatus, and is also applicable to an apparatus other than the exposure apparatus, for example, a dedicated overlay inspection apparatus.

FIG. 12 is a schematic view showing the arrangement of an overlay inspection apparatus 200. The overlay inspection apparatus 200 includes the substrate stage 4 that holds the substrate 3, the substrate alignment detection system 16, and the controller 17. Similar to the exposure apparatus 100, the overlay inspection apparatus 200 can implement high-accuracy overlay inspection using the substrate alignment detection system 16.

When overlay inspection is performed using the substrate alignment detection system 16 of the exposure apparatus 100, a dedicated overlay inspection apparatus such as the overlay inspection apparatus 200 is unnecessary, but the throughput may drop. At an actual manufacturing site, overlay inspection is performed using both the substrate alignment detection system 16 of the exposure apparatus 100 and the overlay inspection apparatus 200. The present invention is applicable to either apparatus.

The present invention is not limited to the exposure apparatus, and is also applicable to a lithography apparatus such as a drawing apparatus or imprint apparatus. Here, the drawing apparatus is a lithography apparatus that draws on a substrate with a charged particle beam (for example, an electron beam or ion beam). The imprint apparatus is a lithography apparatus that molds an imprint material (for example, a resin) on a substrate and forms a pattern on the substrate. The substrate is not limited to an Si wafer, and may be SiC (Silicon Carbide), sapphire, or dopant Si. The present invention is applicable regardless of the substrate material.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-252413 filed on Dec. 5, 2013, which is hereby incorporated by reference herein in its entirety.

What is claimed is:

1. A lithography apparatus for forming a pattern on a substrate, the apparatus comprising:
   a measurement unit configured to measure an amount of overlay shift between a first mark formed on a first surface of the substrate and a second mark formed on a second surface of the substrate opposite to the first surface,
   wherein the measurement unit includes:
   an optical system configured to illuminate the substrate from a side of the first surface with light transmitted by the substrate, and form an image of the first mark with light returning from the first surface and an image of the second mark with light returning from the second surface;
a sensor configured to detect each of the image of the first mark and the image of the second mark; and
a processor configured to execute:
a position determining task that determines a measurement focus position of the optical system at which the sensor is able to detect both the image of the first mark and the image of the second mark based on:
first mark detection information obtained in a focus state of the optical system at which the sensor is able to detect the image of the first mark;
second mark detection information obtained in a focus state of the optical system at which the sensor is able to detect the image of the second mark; and
a distance between the first surface and the second surface;
a detecting task that detects the image of the first mark and the image of the second mark using the sensor at the measurement focus position; and
a position obtaining task that obtains a position of the first mark on the first surface and a position of the second mark on the second surface based on the image of the first mark and the image of the second mark detected by the detecting task,
wherein the first mark detection information includes a first contrast of the image of the first mark,
wherein the second mark detection information includes a second contrast of the image of the second mark, and
wherein the position determining task determines the measurement focus position so that a ratio of a distance from the measurement focus position to the second surface and a distance from the measurement focus position to the first surface coincides with a ratio of the first contrast and the second contrast.

2. The apparatus according to claim 1, wherein the positioning determining task determines a position between the first surface and the second surface as the measurement focus position to simultaneously detect the image of the first mark and the image of the second mark by the sensor.

3. The apparatus according to claim 1, wherein the first mark detection information and the second mark detection information include at least one of a waveform symmetry of a detection signal corresponding to the mark image or a waveform tilt of the detection signal.

4. The apparatus according to claim 1, wherein the position obtaining task obtains:
a first correction value and a second correction value by correcting, based on a defocus characteristic of the optical system, errors arising from defocuses respectively included in a first detection value of the image of the first mark and a second detection value of the image of the second mark that have been detected in the first focus state; and
the position of the first mark on the first surface and the position of the second mark on the second surface based on the first correction value and the second correction value.

5. The apparatus according to claim 4, wherein the position obtaining task obtains:

the first correction value by subtracting, from the first detection value, a product of the defocus characteristic and a distance from the measurement focus position to the first surface of the substrate; and
the second correction value by subtracting, from the second detection value, a product of a value obtained by dividing the defocus characteristic by a refractive index of the substrate, and a distance from the measurement focus position to the second surface.

6. The apparatus according to claim 1, wherein
when a ratio of the first contrast and the second contrast is lower than a threshold, the the position determining task determines a position of the second surface as the measurement focus position.

7. The apparatus according to claim 1, wherein
when the second contrast is lower than a threshold, the position determining task determines a position of the second surface as the measurement focus position.

8. The apparatus according to claim 6, wherein the the distance between the first surface and the second surface is smaller than a predetermined distance.

9. The apparatus according to claim 8, wherein the predetermined distance is double a depth of focus of the optical system.

10. The apparatus according to claim 1, wherein the first mark is larger in line width than the second mark.

11. The apparatus according to claim 1, wherein:
when the distance between the first surface and second surface is smaller than a distance that is double a depth of focus of the optical system, the processor executes the position determining task, the detecting task, and the position obtaining task, and
when the distance between the first surface and second surface is not smaller than the distance that is double the depth of focus of the optical system, the processor executes:
a first detecting task that detects the image of the first mark in the focus state of the optical system at which the sensor is able to detect the image of the first mark;
a first position obtaining task that obtains the position of the image of the first mark on the first surface based on the image of the first mark;
a second detecting task that detects the image of the second mark in the focus state of the optical system at which the sensor is able to detect the image of the second mark; and
a second position obtaining task that obtains the position of the image of the second mark on the second surface based on the image of the second mark.

12. The apparatus according to claim 1, wherein the second mark is made from a metal.

13. A lithography apparatus for forming a pattern on a substrate, the apparatus comprising:
a measurement unit configured to measure an amount of overlay shift between a first mark formed on a first surface of the substrate and a second mark formed on a second surface of the substrate opposite to the first surface,
wherein the measurement unit includes:
an optical system configured to illuminate the substrate with light transmitted by the substrate, and form an image of the first mark with light returning from the first surface and an image of the second mark with light returning from the second surface;
a sensor configured to detect each of the image of the first mark and the image of the second mark; and a processor configured to execute a detecting task that positions, based on a distance between the first surface and the second surface, the optical system in a focus state at which a focus position of the optical system exists between the first surface and second surface, and detects the image of the first mark and the image of the second mark using the sensor in the focus state.

14. The apparatus according to claim 13, wherein the detecting task detects the image of the first mark and the image of the second mark by the sensor in a focus state in which the focus position of the optical system exists at an intermediate position between the first surface and second surface.

15. The apparatus according to claim 13, wherein the second mark is made from a metal.

16. A method of manufacturing an article, the method comprising the steps of:
    forming a pattern on a substrate using a lithography apparatus; and
    processing the substrate on which the pattern has been formed,
    wherein the lithography apparatus includes a measurement unit configured to measure an amount of overlay shift between a first mark formed on a first surface of the substrate and a second mark formed on a second surface of the substrate opposite to the first surface, and
    wherein the measurement unit includes:
        an optical system configured to illuminate the substrate from a side of the first surface with light transmitted by the substrate, and form an image of the first mark with light returning from the first surface and an image of the second mark with light returning from the second surface;
        a sensor configured to detect each of the image of the first mark and the image of the second mark; and
        a processor configured to execute:
            a position determining task that determines a measurement focus position of the optical system at which the sensor is able to detect both the image of the first mark and the image of the second mark based on:
                first mark detection information obtained in a focus state of the optical system at which the sensor is able to detect the image of the first mark;
                second mark detection information obtained in a focus state of the optical system at which the sensor is able to detect the image of the second mark; and
                a distance between the first surface and the second surface;
            a detecting task that detects the image of the first mark and the image of the second mark using the sensor at the measurement focus position; and
            a position obtaining task that obtains a position of the first mark on the first surface and a position of the second mark on the second surface based on the image of the first mark and the image of the second mark detected by the detecting task,
        wherein the first mark detection information includes a first contrast of the image of the first mark,
        wherein the second mark detection information includes a second contrast of the image of the second mark, and
        wherein the position determining task determines the measurement focus position so that a ratio of a distance from the measurement focus position to the second surface and a distance from the measurement focus position to the first surface coincides with a ratio of the first contrast and the second contrast.

17. A method of manufacturing an article, the method comprising the steps of:
    forming a pattern on a substrate using a lithography apparatus; and
    processing the substrate on which the pattern has been formed,
    wherein the lithography apparatus includes a measurement unit configured to measure an amount of overlay shift between a first mark formed on a first surface of the substrate and a second mark formed on a second surface of the substrate opposite to the first surface, and
    wherein the measurement unit includes:
        an optical system configured to illuminate the substrate with light transmitted by the substrate, and form an image of the first mark with light returning from the first surface and an image of the second mark with light returning from the second surface;
        a sensor configured to detect each of the image of the first mark and the image of the second mark; and
        a processor configured to execute a detecting task that positions, based on a distance between the first surface and the second surface, the optical system in a focus state at which a focus position of the optical system exists between the first surface and second surface, and detects the image of the first mark and the image of the second mark using the sensor in the focus state.

18. A lithography apparatus for forming a pattern on a substrate, the apparatus comprising:
    a measurement unit configured to measure an amount of overlay shift between a first mark formed on a first surface of the substrate and a second mark formed on a second surface of the substrate opposite to the first surface,
    wherein the measurement unit includes:
        an optical system configured to illuminate the substrate from a side of the first surface with light transmitted by the substrate, and form an image of the first mark with light returning from the first surface and an image of the second mark with light returning from the second surface;
        a sensor configured to detect each of the image of the first mark and the image of the second mark; and
        a processor configured to execute:
            a position determining task that determines a measurement focus position of the optical system at which the sensor is able to detect both the image of the first mark and the image of the second mark based on:
                first mark detection information obtained in a focus state of the optical system at which the sensor is able to detect the image of the first mark; and
                second mark detection information obtained in a focus state of the optical system at which the sensor is able to detect the image of the second mark;
            a detecting task that detects the image of the first mark and the image of the second mark using the sensor at the measurement focus position; and
            a position obtaining task that obtains a position of the first mark on the first surface and a position of the second mark on the second surface based on the image of the first mark and the image of the second mark detected by the detecting task, wherein the first mark detection information includes a first contrast of the image of the first mark, wherein the second mark detection information includes a second contrast of the image of the second mark, and wherein the position determining task determines, when a ratio of the first contrast and the second contrast is lower than a threshold, a position of the second surface as the measurement focus position.

19. A lithography apparatus for forming a pattern on a substrate, the apparatus comprising:

a measurement unit configured to measure an amount of overlay shift between a first mark formed on a first surface of the substrate and a second mark formed on a second surface of the substrate opposite to the first surface, wherein the measurement unit includes:

an optical system configured to illuminate the substrate from a side of the first surface with light transmitted by the substrate, and form an image of the first mark with light returning from the first surface and an image of the second mark with light returning from the second surface;

a sensor configured to detect each of the image of the first mark and the image of the second mark; and a processor configured to execute:

a position determining task that determines a measurement focus position of the optical system at which the sensor is able to detect both the image of the first mark and the image of the second mark based on:

first mark detection information obtained in a focus state of the optical system at which the sensor is able to detect the image of the first mark; and second mark detection information obtained in a focus state of the optical system at which the sensor is able to detect the image of the second mark;

a detecting task that detects the image of the first mark and the image of the second mark using the sensor at the measurement focus position; and a position obtaining task that obtains a position of the first mark on the first surface and a position of the second mark on the second surface based on the image of the first mark and the image of the second mark detected by the detecting task, wherein the second mark detection information includes a second contrast of the image of the second mark, and wherein the position determining task determines, when the second contrast is lower than a threshold, a position of the second surface of the substrate as the measurement focus position.

* * * * *